(12) United States Patent
Wang et al.

(10) Patent No.: US 6,977,530 B1
(45) Date of Patent: Dec. 20, 2005

(54) PULSE SHAPER CIRCUIT FOR SENSE AMPLIFIER ENABLE DRIVER

(75) Inventors: Ping Wang, Saratoga, CA (US); Mahesh Krishnamurthy, Bangalore (IN)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/771,700

(22) Filed: Feb. 4, 2004

(51) Int. Cl.$^7$ ............................................. G01R 19/00
(52) U.S. Cl. ........................................ 327/51; 327/108
(58) Field of Search .................. 327/100, 108–112, 327/51–57; 326/80–82

(56) References Cited

U.S. PATENT DOCUMENTS

| | | |
|---|---|---|
| 5,087,841 A | 2/1992 | Rogers |
| 5,111,075 A | 5/1992 | Ferry et al. |
| 5,751,180 A | 5/1998 | D'Addeo |
| 6,051,995 A | 4/2000 | Pollachek |
| 6,154,078 A | 11/2000 | Stave |
| 6,414,524 B1 | 7/2002 | Chen |
| 6,483,349 B2 * | 11/2002 | Sakata et al. .................. 326/83 |
| 6,529,050 B1 | 3/2003 | Kuo et al. |
| 6,591,404 B1 | 7/2003 | Argyres |
| 6,606,271 B2 | 8/2003 | Hunt |

* cited by examiner

*Primary Examiner*—Kenneth B. Wells
(74) *Attorney, Agent, or Firm*—Zagorin O'Brien Graham LLP

(57) ABSTRACT

A sense amplifier pulse shaping circuit maintains a relationship between a sense amplifier enable signal and a sense amplifier equalization enable signal while disabling equalization prior to evaluation and disabling evaluation prior to equalization. In some embodiments of the present invention, a sense amplifier pulse shaper circuit generates a sense amplifier equalization control signal and a sense amplifier enable signal. The sense amplifier equalization control signal has a rising transition effectively earlier than the rising transition of the sense amplifier enable signal. The sense amplifier enable signal has a falling transition effectively earlier than the falling transition of the sense amplifier equalization control signal. The sense amplifier equalization signal is discharged into the sense amplifier enable signal.

38 Claims, 2 Drawing Sheets

PULSE SHAPER CIRCUIT FOR SENSE AMPLIFIER ENABLE DRIVER

BACKGROUND

1. Field of the Invention

The present invention relates generally to integrated circuits and, more particularly, to sense amplifier enable drivers.

2. Description of the Related Art

Typically, modern semiconductor memories (whether embodied in a memory integrated circuit or incorporated in larger designs, e.g., as cache memory of a processor integrated circuit) employ differential bit lines and some sort of differential amplifier or sensing circuit in their design. Such differential amplifier and sensing circuits are commonly known as sense amplifiers (sense amps) and a wide variety of sense amplifier designs are known in the art, including current sensing and voltage sensing variations.

Generally, when designing sense amplifiers, great care is taken to optimize timing and balance. Typically, a signal such as a sense amplifier enable (SE) is used to time sense amplifier operation. For example, one state of an SE signal is often used to equalize sense amplifier nodes for a period that allows differential bit-lines to develop sufficient voltage differential to support sensing. Once the differential bit-lines have developed sufficient differential, SE is transitioned to cause the sense amplifier to actually sense the developed differential.

Generally, if the equalization period defined by SE transitions is too short, then the bit-lines may not develop sufficient differential for the sense amplifier to correctly sense the data being read from an addressed memory cell. On the other hand, if too much time is allowed for SE, then access time of the memory circuit is increased and achievable operating frequency (or at least memory access bandwidth) may be reduced. Therefore, in high-speed designs, the SE signal delay path is designed to deliver the SE transition at just the right time to ensure that correct data is being read, while aiming to minimize shortest cycle time.

In some typical sense amplifier designs, the equalization operation and the sensing operation have different requirements. For example, it may be preferable to limit the slope of the SE signal to make the sensing operation more reliable, e.g., by slowing the rate of discharging a common node to reduce false switching inside the sense amplifier but maintaining the rate of discharging the common node so that it is faster than the rate of discharging a bit-line. In addition, the equalization operation is preferably disabled prior to the sensing operation in order to allow a signal to develop. One technique for generating control signals having these different timing requirements uses two separate drivers. However, if two separate drivers are used, a fixed relationship between the signals becomes difficult to maintain due to circuit matching discrepancies, e.g., device mismatches produced by process variations. Accordingly, new techniques are desired to address generation of sense amplifier control signals.

SUMMARY

A sense amplifier pulse shaping circuit maintains a relationship between a sense amplifier enable signal and a sense amplifier equalization enable signal while disabling equalization prior to evaluation and disabling evaluation prior to equalization. In some embodiments of the present invention, a sense amplifier pulse shaper circuit generates a sense amplifier equalization control signal and a sense amplifier enable signal. The sense amplifier equalization control signal has a rising transition effectively earlier than the rising transition of the sense amplifier enable signal. The sense amplifier enable signal has a falling transition effectively earlier than the falling transition of the sense amplifier equalization control signal. The sense amplifier equalization signal is discharged into the sense amplifier enable signal.

In some embodiments of the present invention, an integrated circuit includes an input node, a first switch coupled to the input node, a second switch coupled to the input node, an impedance coupled to the first and the second switches, a sense amplifier equalization enable node, and a sense amplifier evaluation enable node. The sense amplifier equalization enable node receives a first signal. The sense amplifier evaluation enable node receives a second signal. The nodes are coupled to the impedance and respective ones of the first and second switches. A first transition of the first signal is effectively earlier than a first transition of the second signal and a second transition of the second signal is effectively earlier than a second transition of the first signal.

In some embodiments of the present invention, a method for operating a sense amplifier includes substantially matching delays of a first control signal and a second control signal. The first control signal turns on and turns off an equalization of the sense amplifier. The second control signal turns on and turns off the sense amplifier. The method includes effectively turning off equalization of the sense amplifier before effectively turning on a sensing operation. The method includes effectively turning off the sensing operation before effectively turning on the equalization of the sense amplifier. The method includes discharging the first control signal into the second control signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
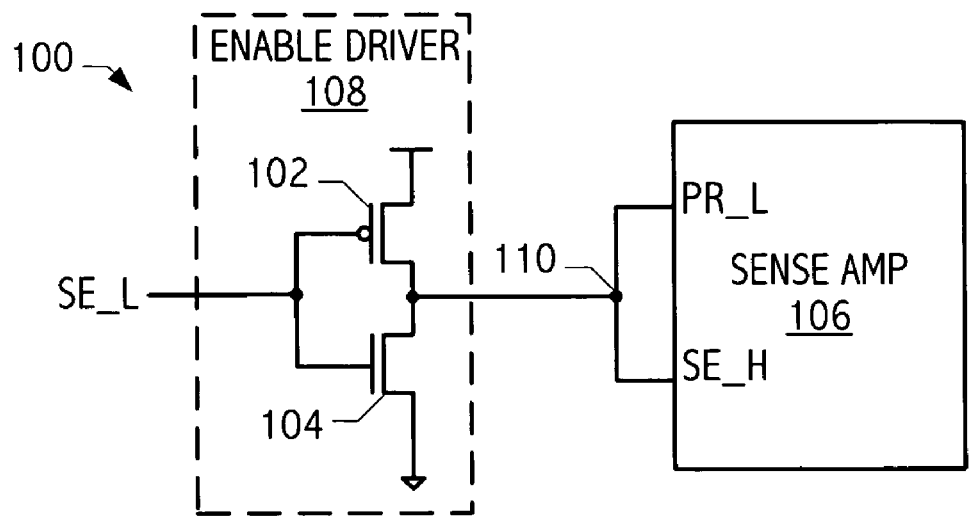
FIG. 1, labeled as prior art, illustrates an exemplary sense amplifier and enable driver.

The description herein focuses on a sense amplifier enable driver that generates a sense amplifier enable signal and a sense amplifier equalization enable signal having different timing requirements but matches characteristics of the two signal paths. Referring to FIG. 1, circuit 100 illustrates an exemplary sense amplifier and enable driver. Sense amplifier 106 is coupled to enable driver circuit 108, which includes p-type transistor 102 and n-type transistor 104. Input SE_L enables both an equalization operation and an evaluation (i.e., sensing) operation of sense amplifier 106. Node 110 drives both PR_L and SE_H. In circuit 100, signal PR_L is an active-low signal for precharging sense amplifier 106 and SE_H is an active-high signal for enabling the evaluation operation of sense amplifier 106. However, in other sense amplifier and enable driver designs, the equalization operation may discharge certain nodes, rather than precharge certain nodes, the equalization operation enable may be an active-high signal, and/or the evaluation operation enable signal may be an active low signal and the invention described herein may be modified consistent with these design variations.

The design illustrated in FIG. 1 uses the same signal for driving PR_L and SE_H, resulting in identical rise times and fall times for the two signals. However, additional control over these transitions of PR_L or SE_H may be desirable, e.g., to limit the slope of the SE signal or to disable the equalization operation prior to the sensing operation. It may also be desirable to maintain a fixed timing relationship between PR_L and SE_H, but vary the relative transition points of these two signals.

Figure 2:
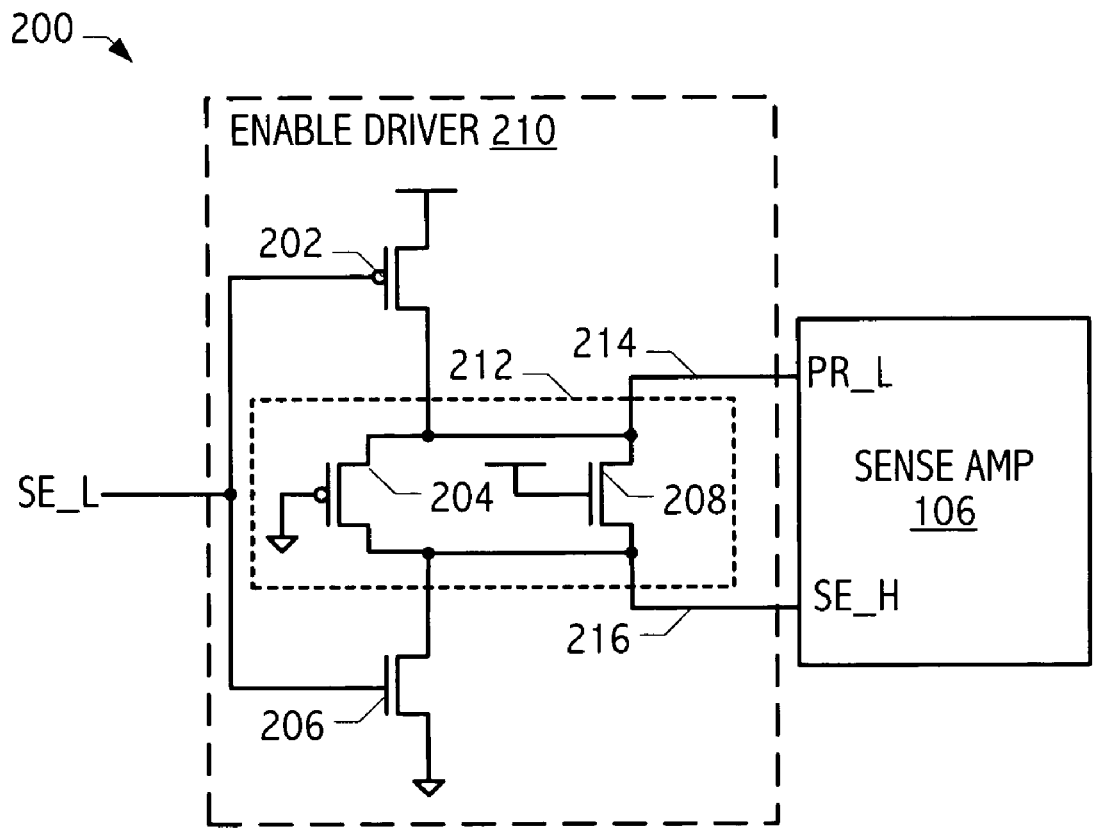
FIG. 2 illustrates an exemplary sense amplifier and enable driver configured consistent with the present invention.

Circuit 200 of FIG. 2 illustrates exemplary sense amplifier 106 and enable driver 210. Enable driver 210 includes p-type transistor 202, n-type transistor 206 and impedance 212. Impedance 212 includes p-type transistor 204 and n-type transistor 208. Transistors 204 and 208 are configured in an 'ON' state. The gate of transistor 204 is coupled to ground and the gate of transistor 208 is coupled to power. Alternatively, transistors 204 and 208 may be turned on based in part on the input signal SE_L, e.g., the gates of transistors 204 and 208 may be coupled to SE_L to independently control the rise and fall times of PR_L and SE_H, or the gates of transistors 204 and 208 may be coupled to nodes 216 and 214, respectively, to limit the voltage swing of PR_L and SE_H if the sense amplifier does not require a full voltage swing. Impedance 212 is not limited to an n-type transistor and a p-type transistor, but may be any suitable circuit.

Input SE_L controls both an equalization operation and an evaluation operation of sense amplifier 106. A signal on node 214 drives PR_L and a signal on node 216 drives SE_H. In circuit 200, signal PR_L is an active-low signal that substantially turns on and substantially turns off a precharge operation in sense amplifier 106 and SE_H is an active-high signal that substantially turns on and substantially turns off the evaluation operation of sense amplifier 106. However, other design variations include a discharge equalization operation, and active-high equalization operation enable signal, and/or an active-low evaluation operation enable signal. Note that in circuit 200, the values of PR_L and SE_H have opposite polarity from the value of SE_L, i.e., when SE_L='1,' PR_L and SE_H='0' and when SE_L='0,' PR_L and SE_H='1.'

When SE_L transitions high (i.e., SE_L='1') transistor 202 substantially turns off and transistor 206 substantially turns on. Transistor 206 discharges node 216 and, in series with the parallel combination of transistors 204 and 208, discharges node 214 (i.e., PR_L and SE_H='0'). Transistors 204 and 208 are sized to adjust the slope of the falling transition of PR_L. In addition, transistors 204 and 208 introduce a delay (measured from mid-point to mid-point) between the transition edges of PR_L and SE_H.

When SE_L transitions low, transistor 202 substantially turns on and transistor 206 substantially turns off. Transistor 202 charges nodes 214 and, in series with the parallel combination of transistors 204 and 208, charges node 216, and nodes 214 and 216 transition high. Transistors 204 and 208 are sized according to a desired slope of the rising transition of SE_H. In addition, transistors 204 and 208 are also sized according to a desired delay (measured from mid-point to mid-point) between the transition edges of PR_L and SE_H.

Figure 3:
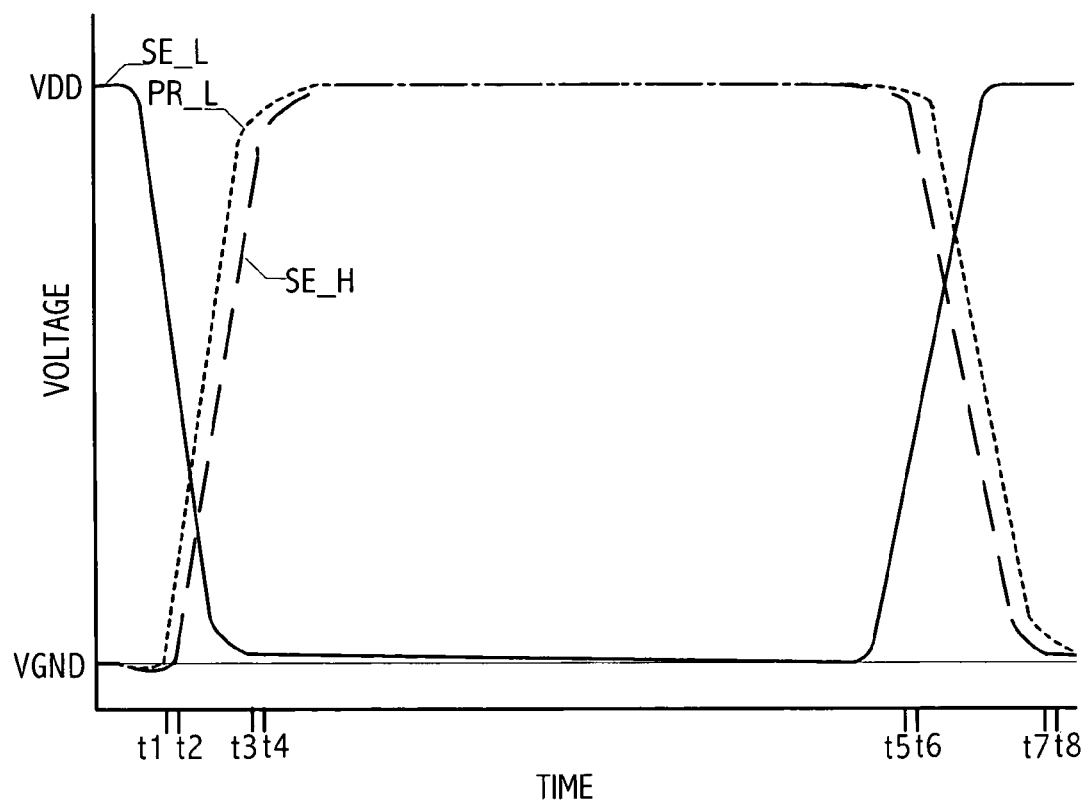
FIG. 3 illustrates exemplary control signals consistent with the present invention.

Waveforms generally illustrating operation of enable driver 210 are included in FIG. 3. At time t1, SE_L has already begun to transition low, and PR_L begins to transition high. At a later time, time t2, SE_H begins to transition high. At time t3, PR_L has completed transitioning high, and at a later time, time t4, SE_H has finished transitioning high. Thus, PR_L substantially turns off the precharge operation of sense amplifier 106 prior to substantially turning on the evaluation operation of sense amplifier 106. The slopes of PR_L and SE_H may vary from each other during the transition from GND to VDD.

At time t5, SE_L has already begun transitioning from GND to VDD and SE_H begins to transition from VDD to GND. PR_L begins transitioning from VDD to GND at a later time, time t6. The transition of SE_H from VDD to GND completes at time t7. The transition of PR_L from VDD to GND completes at a later time, time t8. Thus, SE_H disables the evaluation operation of sense amplifier 106 prior to the enabling of the evaluation operation of sense amplifier 106. The slopes of PR_L and SE_H may vary from each other during the transition from VDD to GND. Note that SE_H and PR_L are substantially in-phase, i.e., SE_L and PR_L overlap at VDD and GND for a substantial interval of time in relation to the absolute time these signals are at VDD and GND.

In an exemplary design, transistors 202, 204, 206, and 208 have schematic widths of 5.52, 2.00, 3.00, and 4.56, respectively in a 0.13 micron process technology. In another exemplary design, transistors 202, 204, 206, and 208 have schematic widths of 3.00, 1.20, 1.20, and 3.00, respectively. For a circuit operating at a nominal voltage of 1.1 V and a clock speed of 1.8 GHz, the rising transition of SE_H may have a several picosecond delay from the low-high transition of PR_L. For a circuit operating at 1.8 GHz, the low-high transition of SE_H may have a several picosecond delay from the low-high transition of PR_L, e.g., in one realization of the invention, the rise times (measured from 20%–80% of the signal voltage) of SE_H and PR_L are 19.8 ps and 13.6 ps, respectively, with a delay (measured from mid-point to mid-point) of 5.7 ps and the fall times (measured from 20%–80% of the signal voltage) of SE_H and PR-L are 15.0 ps and 14.0 ps, respectively, with a delay (measured from mid-point to mid-point) of 8.4 ps. Transistor sizes may vary with the target process technology and set of timing constraints. The sizes described above are exemplary for the particular process technology and set of timing constraints are not meant to be limiting.

While circuits and physical structures are generally presumed, it is well recognized that in modern semiconductor design and fabrication, physical structures and circuits may be embodied in computer readable descriptive form suitable for use in subsequent design, test, or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A sense amplifier pulse shaper circuit, wherein the pulse shaper circuit generates a sense amplifier equalization control signal and a sense amplifier enable signal, the sense amplifier equalization control signal having a rising transition effectively earlier than the rising transition of the sense amplifier enable signal, the sense amplifier enable signal having a falling transition effectively earlier than the falling transition of the sense amplifier equalization control signal, and the sense amplifier equalization signal being discharged into the sense amplifier enable signal.

2. The sense amplifier pulse shaper circuit, as recited in claim 1, wherein the sense amplifier equalization control signal and the sense amplifier enable signal are substantially in-phase.

3. The sense amplifier pulse shaper circuit, as recited in claim 1, wherein the sense amplifier equalization control signal and the sense amplifier enable signal have a value opposing an input value.

4. The sense amplifier pulse shaper circuit, as recited in claim 1, wherein a slope of a transitioning edge of the sense amplifier enable signal varies from a slope of a transitioning edge of the sense amplifier equalization control signal.

5. An integrated circuit comprising:
an input node;
a first switch coupled to the input node;
a second switch coupled to the input node;
an impedance coupled to the first and the second switches; and
a sense amplifier equalization enable node for receiving a first signal and a sense amplifier evaluation enable node for receiving a second signal, the nodes coupled to the impedance and respective ones of the first and second switches, wherein a first transition of the first signal is effectively earlier than a first transition of the second signal and a second transition of the second signal is effectively earlier than a second transition of the first signal.

6. The integrated circuit, as recited in claim 5, wherein a slope of a transitioning edge of the first signal varies from a slope of a transitioning edge of the second signal.

7. The integrated circuit, as recited in claim 5, wherein the first transition of the first signal is a rising transition, the first transition of the second signal is a rising transition, the second transition of the first signal is a falling transition, and the second transition of second signal is a falling transition.

8. The integrated circuit, as recited in claim 5, further comprising:
a sense amplifier coupled to the sense amplifier equalization enable node and the sense amplifier evaluation enable node.

9. The integrated circuit, as recited in claim 5, wherein the first transition of the first signal is based at least in part on the first switch.

10. The integrated circuit, as recited in claim 5, wherein the first transition of the second signal is based at least in part on the first switch and the impedance.

11. The integrated circuit, as recited in claim 5, wherein the second transition of the first signal is based at least in part on the second switch and the impedance.

12. The integrated circuit, as recited in claim 5, wherein the second transition of the second signal is based at least in part on the second switch.

13. The integrated circuit, as recited in claim 5, wherein the first switch is coupled to the power node.

14. The integrated circuit, as recited in claim 5, wherein the second switch is coupled to the ground node.

15. The integrated circuit, as recited in claim 5, wherein the first and second switches are complementary devices.

16. The integrated circuit, as recited in claim 15, wherein the first switch is a p-type transistor and the second switch is an n-channel transistor.

17. The integrated circuit, as recited in claim 5, wherein the impedance includes a first and a second device.

18. The integrated circuit, as recited in claim 17, wherein the first and the second devices are complementary devices.

19. The integrated circuit, as recited in claim 17, wherein the first device is a p-type transistor and the second device is an n-type transistor.

20. The integrated circuit, as recited in claim 5, wherein the first signal and the second signal are substantially in-phase.

21. The integrated circuit, as recited in claim 5, wherein the sense amplifier equalization control node and the sense amplifier evaluation enable node receive signals opposing an input signal.

22. The integrated circuit, as recited in claim 5, embodied in computer readable descriptive form suitable for use in design, test, or fabrication of an integrated circuit.

23. A method for operating a sense amplifier, comprising:
substantially matching delays of a first control signal, the first control signal for substantially turning on and substantially turning off an equalization of the sense amplifier and a second control signal, the second control signal for substantially turning on and substantially turning off the sense amplifier;
substantially turning off equalization of the sense amplifier before substantially turning on a sensing operation;
effectively turning off the sensing operation before effectively turning on the equalization of the sense amplifier; and
discharging the first control signal into the second control signal.

24. The method, as recited in claim 23, further comprising:
adjusting a slope of a transitioning edge of the control signal for turning on and turning off an equalization of the sense amplifier.

25. The method for operating a sense amplifier, as recited in claim 23, wherein the matching includes generating the control signals with a single driver.

26. The method for operating a sense amplifier, as recited in claim 25, wherein the single driver includes a first output node and a second output node.

27. The method for operating a sense amplifier, as recited in claim 23, further comprising:
matching a phase of control signals for turning on and turning off an equalization of the sense amplifier and substantially turning on and;
substantially turning off the sense amplifier.

28. The method for operating a sense amplifier, as recited in claim 27, wherein the equalization of the sense amplifier is active low.

29. The method for operating a sense amplifier, as recited in claim 27, wherein the sense amplifier turning on is active high.

30. The method for operating a sense amplifier, as recited in claim 26, wherein the first and second output nodes are coupled to an impedance.

31. The method for operating a sense amplifier, as recited in claim 26, wherein the first output node is coupled to a first switch.

32. The method for operating a sense amplifier, as recited in claim 26, wherein the second output node is coupled to a second switch.

33. The method for operating a sense amplifier, as recited in claim 27, wherein the equalization of the sense amplifier is a precharge.

34. An apparatus comprising:
   means for substantially matching delays of a first control signal and a second control signal;
   means for substantially turning off precharging of the sense amplifier before substantially turning on a sensing operation;
   means for substantially turning off the sensing operation before substantially turning on the precharging of the sense amplifier; and
   means for discharging the first control signal into the second control signal.

35. The apparatus of 34, further comprising:
   means for adjusting a slope of a transitioning edge of the control signal for turning on and turning off an equalization of the sense amplifier.

36. The apparatus of 34, further comprising:
   means for matching a phase of control signals for substantially turning on and substantially turning off a precharging of the sense amplifier and substantially turning on and substantially turning off the sense amplifier.

37. A method of manufacturing an integrated circuit comprising:
   forming an input node;
   forming a first switch coupled to the input node;
   forming a second switch coupled to the input node;
   forming an impedance coupled to the first and the second switches; and
   forming a sense amplifier equalization enable node for receiving a first signal and a sense amplifier evaluation enable node for receiving a second signal, the nodes coupled to the impedance and respective ones of the first and second switches, wherein a first transition of the first signal is effectively earlier than a first transition of the second signal and a second transition of the second signal is effectively earlier than a second transition of the first signal.

38. The method of manufacturing an integrated circuit, as recited in claim 37, further comprising:
   forming a sense amplifier coupled to the sense amplifier equalization enable node and the sense amplifier evaluation enable node.

* * * * *

UNITED STATES PATENT AND TRADEMARK OFFICE
CERTIFICATE OF CORRECTION

PATENT NO. : 6,977,530 B1
DATED : December 20, 2005
INVENTOR(S) : Ping Wang and Mahesh Krishnamurthy It is certified that error appears in the above-identified patent and that said Letters Patent is hereby corrected as shown below:

Column 6,
Lines 52 and 53, delete "substantially turning on and; substantially turning off the sense amplifier." and insert -- substantially turning on and substantially turning off the sense amplifier. --.

Signed and Sealed this

Eleventh Day of April, 2006

JON W. DUDAS
*Director of the United States Patent and Trademark Office*